(12) United States Patent
Shyu et al.

(10) Patent No.: US 11,431,117 B2
(45) Date of Patent: Aug. 30, 2022

(54) PIN SIDE EDGE MOUNT CONNECTOR AND SYSTEMS AND METHODS THEREOF

(71) Applicant: Lockheed Martin Corporation, Bethesda, MD (US)

(72) Inventors: Samuel Muen Shyu, Santa Clara, CA (US); Raymond Yu, Sunnyvale, CA (US); Robert James Hill, Sunnyvale, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 17/158,517

(22) Filed: Jan. 26, 2021

(65) Prior Publication Data

US 2021/0151913 A1 May 20, 2021

Related U.S. Application Data

(63) Continuation of application No. 16/550,956, filed on Aug. 26, 2019, now abandoned.

(51) Int. Cl.
| | |
|---|---|
| *H01R 12/00* | (2006.01) |
| *H01R 12/58* | (2011.01) |
| *H01R 12/72* | (2011.01) |
| *H01R 43/20* | (2006.01) |
| *H05K 3/30* | (2006.01) |
| *H05K 1/18* | (2006.01) |

(52) U.S. Cl.
CPC ......... *H01R 12/585* (2013.01); *H01R 12/721* (2013.01); *H01R 43/205* (2013.01); *H05K 1/184* (2013.01); *H05K 3/306* (2013.01); *H05K 2201/10189* (2013.01); *H05K 2201/10303* (2013.01); *H05K 2201/10446* (2013.01)

(58) Field of Classification Search
CPC .. H01R 43/205; H01R 12/721; H01R 12/585; H05K 1/184; H05K 3/306; H05K 2201/10189; H05K 2201/10303; H05K 2201/10446
USPC ..................................................... 439/55–82
See application file for complete search history.

(56) References Cited

U.S. PATENT DOCUMENTS

| | | | |
|---|---|---|---|
| 3,280,378 A | 10/1966 | Brady et al. |
| 3,281,627 A | 10/1966 | Fetterolf et al. |
| 3,531,581 A | 9/1970 | Chesemore |
| 4,718,854 A | 1/1988 | Capp et al. |
| 5,122,064 A | 6/1992 | Zarreii |
| 5,447,442 A | 9/1995 | Swart |
| 6,863,543 B2 | 3/2005 | Lang et al. |
| 7,367,812 B2 | 5/2008 | Shih et al. |

(Continued)

FOREIGN PATENT DOCUMENTS

WO 2006067028 A2 6/2006

OTHER PUBLICATIONS

International Search Report and Written Opinion for Application No. PCT/US2020/047727 dated Jan. 21, 2021 (15 pages).

*Primary Examiner* — Khiem M Nguyen
(74) *Attorney, Agent, or Firm* — Michael Best & Friedrich LLP

(57) ABSTRACT

A printed circuit board (PCB) device including one or more insulating layers and one or more conducting layers arranged to form a layer stack; and one or more blind holes disposed along a side edge of the layer stack and parallel to a plane of the layer stack. Each of the one or more blind holes along the side edge of the layer stack is configured to receive a pin. Each pin can make an electrical connection with a corresponding blind hole.

18 Claims, 7 Drawing Sheets

(56) References Cited

U.S. PATENT DOCUMENTS

| | | |
|---|---|---|
| 8,491,340 B2 | 7/2013 | Sass et al. |
| 8,747,164 B2 | 6/2014 | Westman et al. |
| 9,312,618 B2 | 4/2016 | Regnier et al. |
| 9,470,530 B2 | 10/2016 | Thomas |
| 9,601,852 B2 | 3/2017 | Yi et al. |
| 9,980,378 B1 | 5/2018 | Mutnury et al. |
| 10,375,849 B2 | 8/2019 | Guillot et al. |
| 2008/0220665 A1 | 9/2008 | Darr et al. |

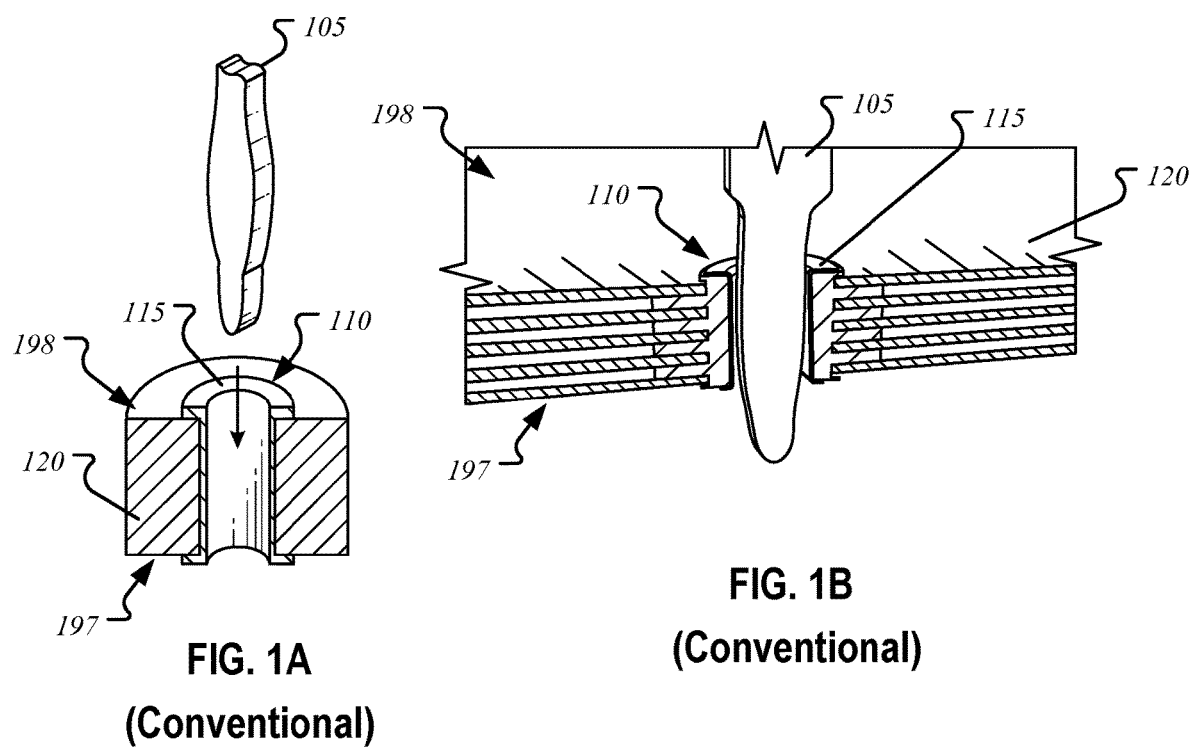
FIG. 1A
(Conventional)
FIG. 1B
(Conventional)

PIN SIDE EDGE MOUNT CONNECTOR AND SYSTEMS AND METHODS THEREOF

Embodiments of the disclosed subject matter relate to pin edge mount connectors and systems and methods thereof

SUMMARY

The present disclosure relates to a printed circuit board (PCB) device including: one or more insulating layers and one or more conducting layers arranged to form a layer stack, a plane of the one or more insulating layers being parallel to a plane of the one or more conducting layers; one or more conducting tracks; and one or more blind holes disposed in a side edge of the layer stack, each of the one or more blind holes having a depth that extends from the side edge into the layer stack in a direction parallel to the plane of the one or more insulating layers and the plane of the one or more conducting layers, the one or more blind holes being plated with a conducting material, wherein each of the one or more blind holes is configured to receive a pin.

The present disclosure additionally relates to a printed circuit board (PCB) system including: one or more insulating layers and one or more conducting layers arranged to form a layer stack; one or more blind holes disposed along a side edge of the layer stack and parallel to a plane of the layer stack; at least one pin; and a housing configured to hold the at least one pin and be removably mounted to the side edge of the layer stack, wherein each said at least one pin held by the housing is configured to be inserted into and retained by a respective one of the one or more blind holes.

The present disclosure additionally relates to a method, including providing one or more insulating layers and one or more conducting layers arranged to form a layer stackup, a plane of the one or more insulating layers being parallel to a plane of the one or more conducting layers; providing one or more conducting tracks to electrically couple one or more blind holes to components on the layer stack; and providing one or more blind holes disposed in a side edge of the layer stack, each of the one or more blind holes having a depth that extends from the side edge into the layer stack in a direction parallel to the plane of the one or more insulating layers and the plane of the one or more conducting layers, the one or more blind holes being plated with a conducting material, wherein each of the one or more blind holes is configured to receive a pin.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIGS. 1A and 1B show sectional views of a pin inserted into a through-hole via of a printed circuit board (PCB) according to a conventional approach.

DETAILED DESCRIPTION

Figure 2:
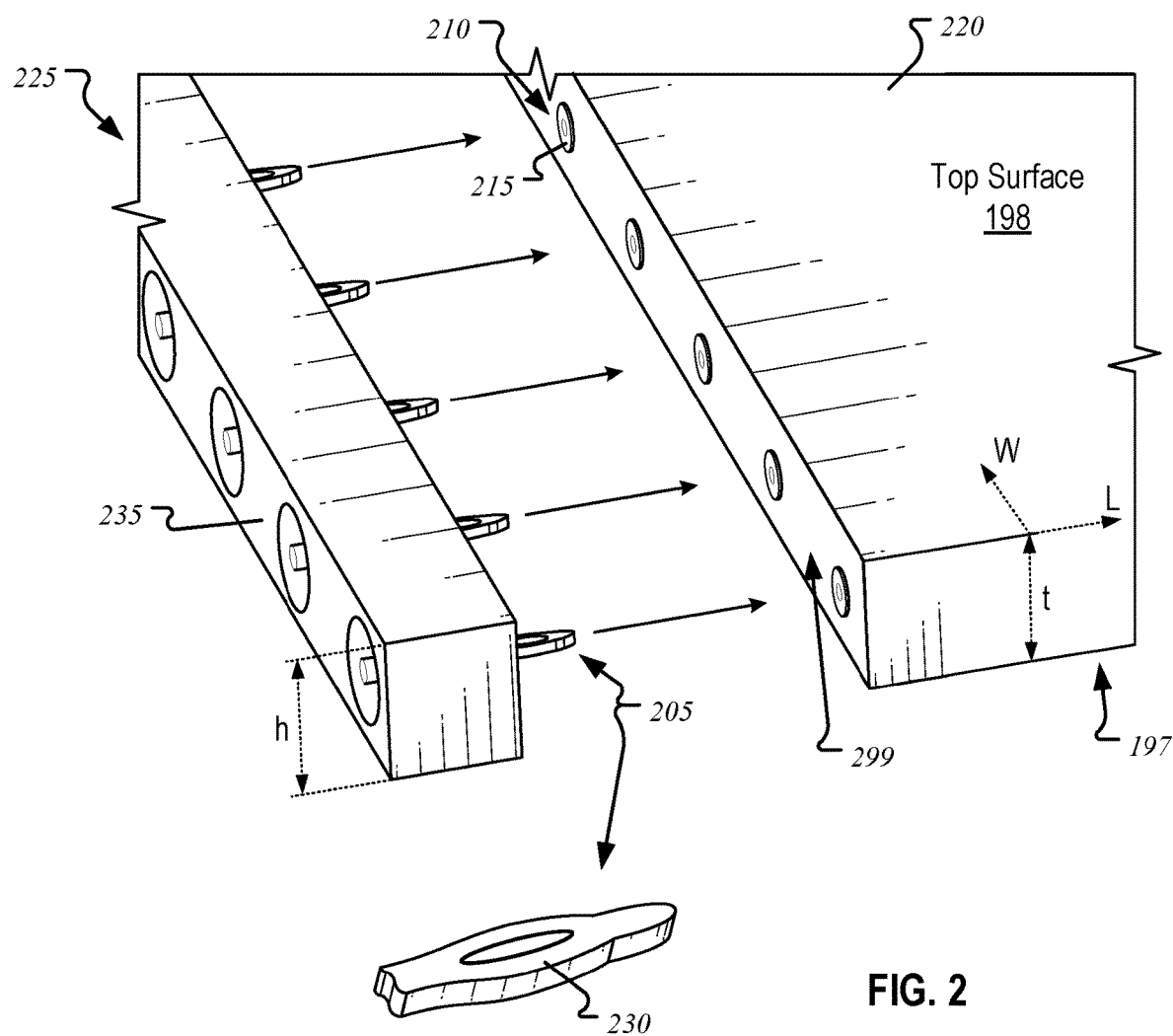
FIG. 2 is a perspective view of a PCB and an edge mount connector, according to an exemplary embodiment of the present disclosure.

The description set forth below in connection with the appended drawings is intended as a description of various aspects of the disclosed subject matter and is not necessarily intended to represent the only aspect(s). In certain instances, the description includes specific details for the purpose of providing an understanding of the disclosed subject matter. However, it will be apparent to those skilled in the art that aspects may be practiced without these specific details. In some instances, well-known structures and components may be shown in block diagram form in order to avoid obscuring the concepts of the disclosed subject matter.

Reference throughout the specification to "one aspect" or "an aspect" means that a particular feature, structure, characteristic, operation, or function described in connection with an aspect is included in at least one aspect of the disclosed subject matter. Thus, any appearance of the phrases "in one aspect" or "in an aspect" in the specification is not necessarily referring to the same aspect. Further, the particular features, structures, characteristics, operations, or functions may be combined in any suitable manner in one or more aspects. Further, it is intended that aspects of the disclosed subject matter can and do cover modifications and variations of the described aspects.

It must be noted that, as used in the specification and the appended claims, the singular forms "a," "an," and "the" include plural referents unless the context clearly dictates otherwise. That is, unless clearly specified otherwise, as used herein the words "a" and "an" and the like carry the meaning of "one or more." Additionally, it is to be understood that terms such as "upper," "lower," "front," "rear," "side," "interior," "exterior," and the like that may be used herein, merely describe points of reference and do not necessarily limit aspects of the disclosed subject matter to any particular orientation or configuration. Furthermore, terms such as "first," "second," "third," etc., merely identify one of a number of portions, components, points of reference, operations and/or functions as described herein, and likewise do not necessarily limit aspects of the disclosed subject matter to any particular configuration or orientation.

A printed circuit board (PCB) may range in complexity from a single planar layer including tracks to connect components and vias on a single surface (i.e., a 1-layer PCB), to multi-layer stacks with track designs including tracks routed between layers to reach vias that may be buried, blind, or through-hole vias. Connectors holding pins may be attached to the PCB such that the pins are inserted into the vias in a substantially transverse (e.g., perpendicular) orientation relative to the plane of the PCB layer(s). The transverse orientation of the inserted pins can yield a connector package that may sit on a top or bottom surface of the PCB itself.

FIG. 1A shows an example of the substantially transverse configuration. FIG. 1A illustrates a sectional perspective view of an exemplary pin 105, but in the context of interfacing with a top surface 198 (or a bottom surface 197 depending upon frame of reference) of a printed circuit board (PCB) 120. FIG. 1B illustrates a sectional perspective view of the pin 105 installed orthogonal to the printed circuit board (PCB) 120. The PCB 120 may include a through-hole via 110 that is plated with a plating 115 that is conductive. The pin 105 may be inserted into the through-hole via 110 such that the pin 105 makes electrical contact with the plating 115. The PCB 120 may include at least one conductive track (not shown) that electrically connects the through-hole via 110 (by contacting the plating 115) to other components of the PCB 120. The conductive track and plating 115 may be a material that is conductive, for example, copper, silver, graphene, or gold. The pin 105 may be connected to a connector (not shown), which may include additional pins 105 in an array. The connector may be displaced over a surface of the PCB 120 in order to hold all the pins 105. The connector may subsequently be connected to another connector connected to another PCB 120, such that the two connectors electrically couple the two PCBs 120. Optionally, the connector may instead be connected to other electrical components.

The plated through-hole via 110 can carry current and pass through two or more reference layers in a substantially transverse orientation (relative to the plane of the PCB), which may generate electromagnetic (EM) radiation that may be emitted from side edges of the PCB. More specifically, an EM wave may propagate radially away from the plated through-hole via 110 within the cavity between the two or more reference layers, and upon reaching the PCB side edge, the two reference layers may form a slot antenna and radiate noise. Such noise may cause electromagnetic interference (EMI) to nearby equipment. Additionally, plated through-hole vias that include a stub portion may generate resonant frequency nulls that align with or near the Nyquist frequency of the bit rate, which can result in high bit-error-ratio or link failure. For example, the through-hole via may extend through five layers of the PCB, but the track between the second and third layer of the five layers connects the through-hole via to another component in the third layer. Thus, the stub portion may comprise the portion of the through-hole via in the third, fourth, and fifth layers that acts as an open circuit.

The stub portion may also cause a quarter-wave resonance when a sinusoidal signal is injected from a source into the pin at the top of the through-hole via and travels along the electrically connective portion until the signal reaches the junction of the track and the stub portion. Here, the sinusoidal signal may split, wherein some of the signal travels along the track, and the remainder continues down the stub portion. Once the remainder reaches the other side of the stub portion, it may reflect towards the electrically connective portion. And upon reaching the track junction, the remainder portion of the signal may split again, with a portion traveling along the track and the remainder back to the source. If the time delay through the stub portion is equal to a quarter wavelength of the sinusoidal signal and the sinusoidal signal reflects at the stub portion, upon reaching the track junction again the sinusoidal signal will be delayed by a half of a cycle and cancel most of the original signal.

In view of the foregoing, an improved configuration that can allow for parallel stacking of PCBs and/or for reducing EMI and resonance nulls is desired. Embodiments of the disclosed subject matter involve plated blind holes disposed along a side edge of a PCB, particularly where the blind holes are configured to receive connector pins.

FIG. 2 illustrates a perspective partial view of a PCB 220 and an edge mount connector 225, according to an exemplary embodiment of the present disclosure. In an embodiment, the edge mount connector 225 may be configured to hold at least one pin 205, and the PCB 220 may include at least one blind edge via 210. FIG. 2, for instance, shows a plurality of pins 205, though the discussion herein may refer to the pins 205 in singular form as "pin 205" in reference to each of the pins 205.

The pin 205 may be attached (e.g., removably attached) to the edge mount connector 225 and configured to be inserted into the at least one blind edge via 210. FIG. 2, for instance, shows a plurality of blind edge vias 210, though the discussion herein may refer to the blind edge vias 210 in singular form as "blind edge via 210" in reference to each of the blind edge vias 210. The blind edge via 210 may be plated with a plating 215. As used herein, blind edge vias may be referred to as blind holes.

In an embodiment, the pin 205 may be, for example, a compliant pin and include a compliant portion 230. The compliant portion 230 may deform when abutting sidewall(s) of the blind edge via 210 (including the plating 215 plated therein). In this manner, the pin 205 may be inserted into the blind edge via 210 even if a diameter of the blind edge via 210 is narrower than a non-inserted diameter of the compliant portion 230. Such configuration of the pin 205 may increase tolerance to variability of sizing of the one blind edge via 210. Notably, the compliant portion 230 may exert a predetermined force against the sidewall(s) of the blind edge via 210, which can lead to a reversible cold welding between the two structures.

The connection between the two structures can provide a reliable mechanical and electrical connection between the pin 205 and the plating 215 of the blind edge via 210. Advantageously, using the pin 205 can provide for solderless, internally powerful, gas-tight connections and can allow for removal and replacement of the pin 205 as compared to a pin that is soldered into the blind edge via 210. Additionally, the compliant portion 230 of the pin 205 can allow the pin 205, and any structure attached to the pin 205 (e.g., edge mount connector 225 described below), to attach to the PCB 220 without the assistance of an additional fastening device, for example, fastening screws, clasps, clips, and the like.

In an embodiment, the PCB 220 may be any circuit board used by those in the art. For example, a single-sided, double-sided, or multi-layered PCB. The PCB 220 may also be, for example, an integrated circuit (IC) such as an application-specific IC, or a hybrid circuit. The PCB 220 may be fabricated from common substrate material for circuit boards, such as epoxy resin impregnated with woven glass fiber to form a planar panel. In a multi-layer PCB 220, multiple panels may be stacked in layers, alternating with layers of adhesive-backed foil, for example copper foil, wherein the panels may be made insulating for some layers.

The PCB 220 may include a plurality of vias, such as through-hole vias, blind vias (e.g. blind edge via 210), and buried vias, where the vias may be plated in order to electrically connect components in or on various layers of the PCB 220. Other than blind edge holes or vias as defined herein (e.g., blind edge via 210), through-hole vias may be holes extending through the PCB 220, from the top surface 198 to the opposite bottom surface 197 of the PCB 220. Generally, according to embodiments of the disclosed subject matter, blind vias may be holes starting at any exterior surface of the PCB 220 (or portions thereof, such as a single stack of a plurality of stacks of the PCB 220) and extending through a portion of the multi-layer stack. Buried vias, on the other hand, may be holes formed by both starting and ending in an interior layer of the multi-layer stack.

In an embodiment, the blind edge via 210 can be a substantially cylindrical volume of material removed from the PCB 220 along a side edge 299 of the PCB 220. As used herein, "side edge 299" may refer to edges of the PCB 220 other than the top surface 198 and the bottom surface 197 and can include front, back, left and right side edges 299, whether free edges or mounted to a chassis or other fixture. That is to say, the PCB 220 may have a thickness t (i.e., for the side edge 299) that is significantly less in dimension than a length L and a width W of the PCB 220. The surfaces formed along the length L and width W of the PCB 220 may be the top 198 and bottom surfaces 197 of the PCB 220.

A cross-sectional shape of the blind edge via 210 may be circular, and the blind edge via 210 may be formed (e.g., drilled) into the side edge 299 of the PCB 220. It should be noted that other shapes for the blind edge via 210 volume may be used, such as a square or oval cross-section. The blind edge via 210 may have a diameter and extend a predetermined depth into the side edge 299 of the PCB 220. The blind edge via 210 may be configured to receive the pin 205, as indicated above in discussing the pin 205. Thus, the predetermined depth may be determined, for example, based on a length of the pin 205 inserted therein. Alternatively, dimensions of the pin 205, such as length, diameter, etc., may be set based on corresponding characteristics of the blind edge via 210, such as depth, diameter, etc.

As previously mentioned, the blind edge via 210 may be plated with the plating 215 to provide a conductive surface for the pin 205 to contact when inserted. Thus, the blind edge via 210 (including the plating 215 therein) may have a predetermined diameter (or width for a square cross-section), wherein the predetermined diameter may be determined by a width of the compliant portion 230 of the pin 205. For example, the predetermined diameter may be marginally narrower than the width of the compliant portion 230 such that the compliant portion 230 is deformed (made narrower) upon insertion into the blind edge via 210 in order to form a reversible cold weld.

In an embodiment, the edge mount connector 225 may be an extended structure holding a plurality of the pins 205 (as shown). The PCB 220 may include a plurality of the blind edge vias 210 along one or more side edges 299 the PCB 220 (FIG. 2, for instance, shows blind edge vias 210 along only one side edge 299). The plurality of pins 205 may be spaced along the edge mount connector 225 according to a spacing of the plurality of blind edge vias 210. Thus, the pins 205 may be aligned with the blind edge vias 210 for mutual insertion (i.e., simultaneous insertion) of the pins 205 into the respective blind edge vias 210. The edge mount connector 225 may include a housing 235 having a height h. The height h of the housing 235 may be substantially equal to the thickness t of the PCB 220. Optionally, one or more edge mount connectors 225 may be provided, one or more per each side edge 299 of the PCB 220.

Figure 3:
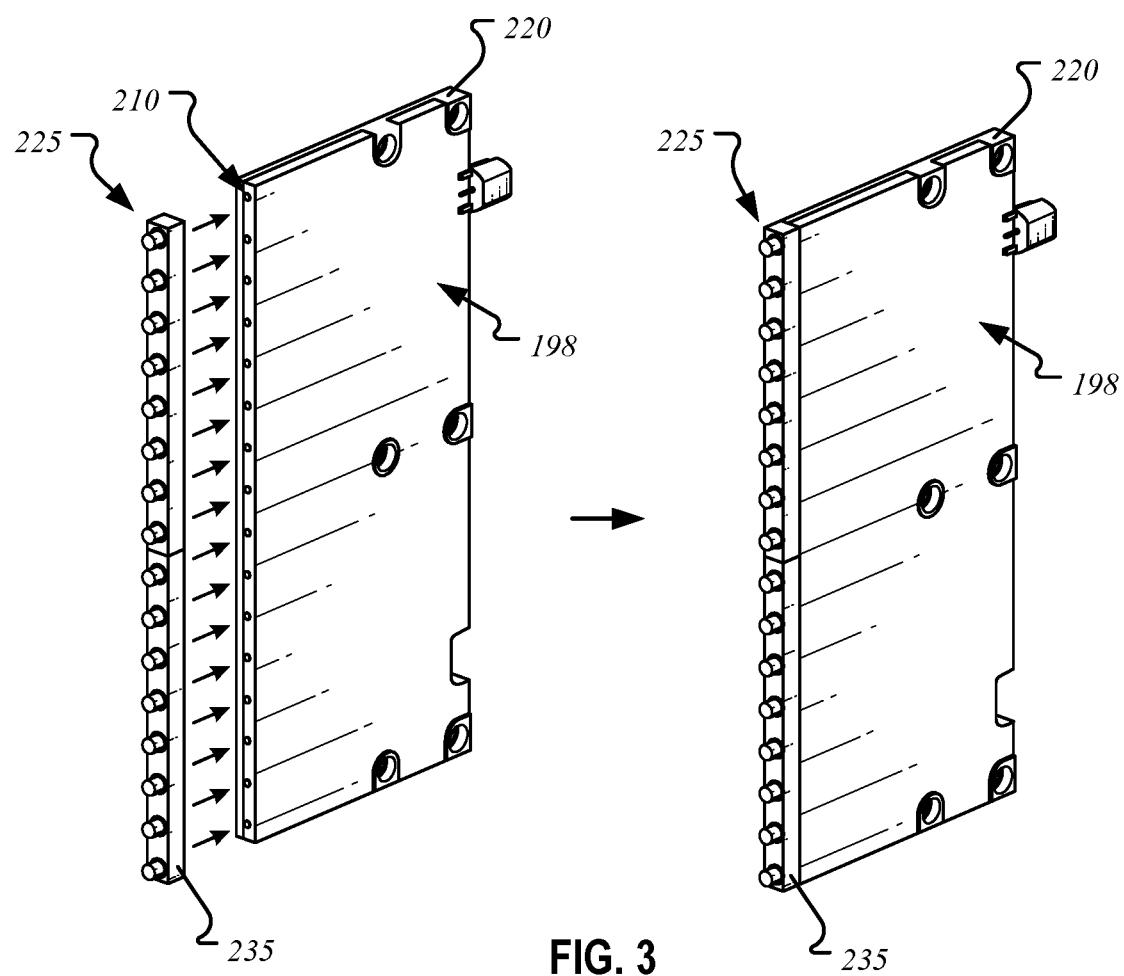
FIG. 3 shows perspective views of an edge mount connector mountable on a PCB, according to an exemplary embodiment of the present disclosure.

FIG. 3 illustrates perspective "assembly" views of the edge mount connector 225 mounted to the PCB 220, according to an exemplary embodiment of the present disclosure. Generally speaking, the edge mount connector 225 may be removably connected to the PCB 220, meaning that the edge mount connector 225 can be reliably held to the PCB 220 such that suitable mechanical connections can be established between the pins and the blind edge vias 210 and removed from the PCB 220 with the pins 205 remaining with the edge mount connector 225.

The edge mount connector 225 may be moved towards one of the side edges 299 (e.g., left side edge 299) of the PCB 220 such that the plurality of pins 205 are aligned and inserted into corresponding respective ones of the plurality of blind edge vias 210. For example, the edge mount connector 225 may be pressed into the side edge of the PCB 220 such that the plurality of pins 205 are press-fit into the corresponding respective ones of the plurality of blind edge vias 210. Notably, the edge mount connector 225 may not be provided on either the top surface 198 or the bottom surface 197 of the PCB 220.

Figure 4A:
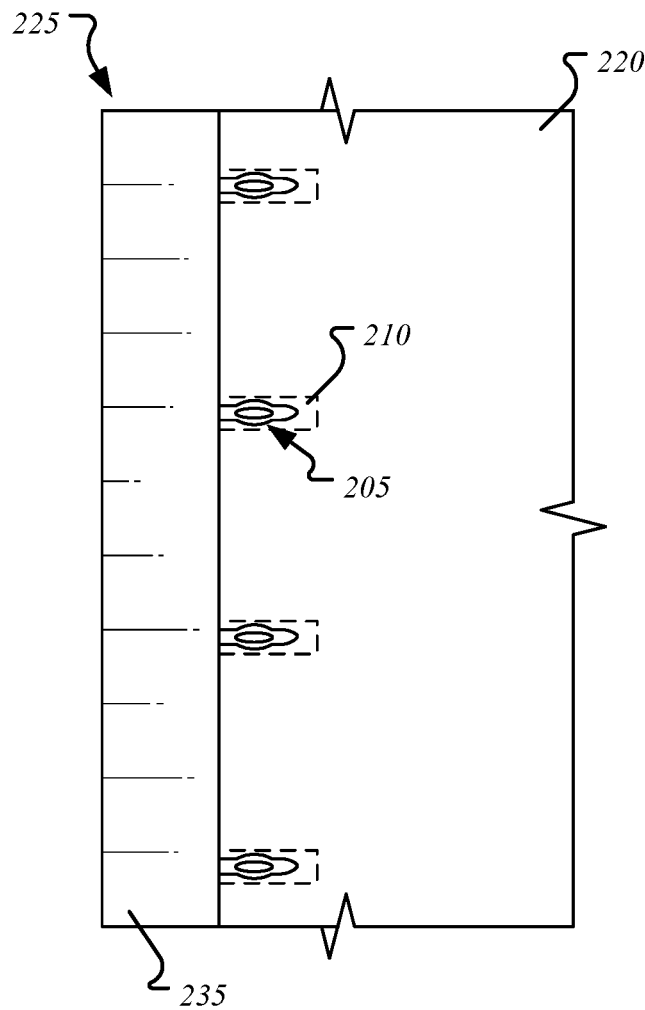
FIG. 4A is a cross-sectional view of an edge mount connector mounted on a PCB, according to an exemplary embodiment of the present disclosure.
Figure 4B:
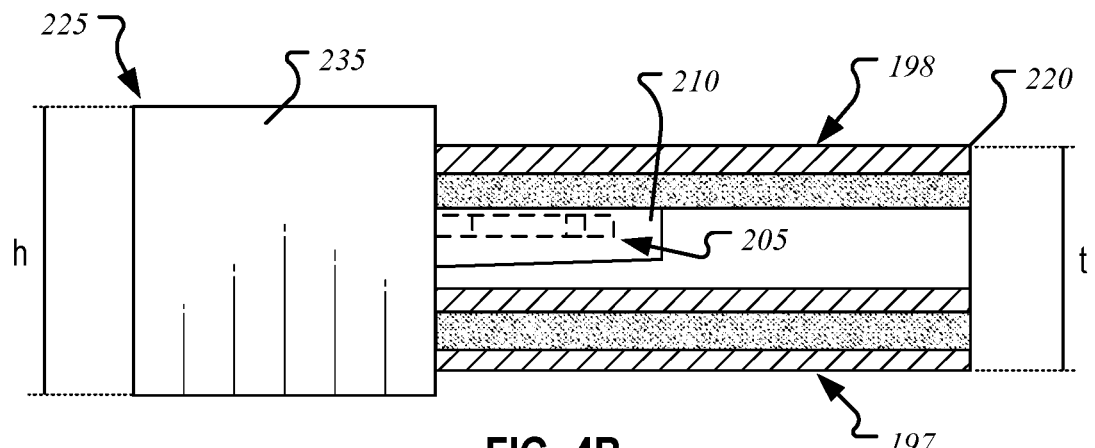
FIG. 4B is a cross-sectional view of an edge mount connector mounted on a PCB with multiple layers, according to an exemplary embodiment of the present disclosure.

FIG. 4A illustrates a partial cross-sectional view of the edge mount connector 225 mounted on the PCB 220, according to an exemplary embodiment of the present disclosure. FIG. 4B illustrates a cross-sectional view of the edge mount connector 225 mounted on the PCB 220 with multiple layers, according to an exemplary embodiment of the present disclosure. As previously mentioned, multiple panels of the PCB 220 may be stacked together and alternating with layers of conductive foil to form a layer stack, wherein the panels may be made insulating for some layers. This may result in the PCB 220 with the thickness t in FIG. 4B.

In an embodiment, the thickness t may be greater than the diameter of the at least one pin 205. The blind edge via 210 may be disposed between the top surface 198 and bottom surface 197 of the PCB 220. In an embodiment, the thickness t may be greater than the diameter of the blind edge vias 210, and the predetermined locations of the blind edge vias 210 between the layers may be determined by which layers a user may desire for the blind edge via 210 (and the pin 205 inserted therein) to electrically contact.

In an embodiment, the pins 205 and the blind edge vias 210 may be keyed, wherein an arrangement of the pins 205 and the blind edge vias 210 may be such that a predetermined arrangement of the pins 205 on the edge mount connector 225 may allow connection to a predetermined side edge 299 with a corresponding arrangement of blind edge vias 210.

Concomitantly, an incorrect arrangement of the pins 205 on a non-corresponding edge mount connector 225 may prevent the non-corresponding edge mount connector 225 from mounting to a non-corresponding side edge 299 due to the pins 205 not coupling with the blind edge vias 210 of the non-corresponding side edge 299. For example, the pins 205 may have a predetermined spacing that matches the spacing of the blind edge vias 210 and the non-corresponding edge mount connector 225 mounted on non-corresponding side edge 299 may result in the pins 205 misaligned with the blind edge vias 210. It may be appreciated that the blind edge vias 210 have the predetermined spacing. In another example, the pins 205 may have varying lengths and the predetermined arrangement of pins 205 with varying lengths may correspond to an arrangement of blind edge vias 210 with corresponding varying depths.

In another example, the pins 205 may have varying cross-sectional shapes and the predetermined arrangement of pins 205 with varying cross-sectional shapes may correspond to an arrangement of blind edge vias 210 with corresponding varying cross-sectional shapes.

Figure 4C:
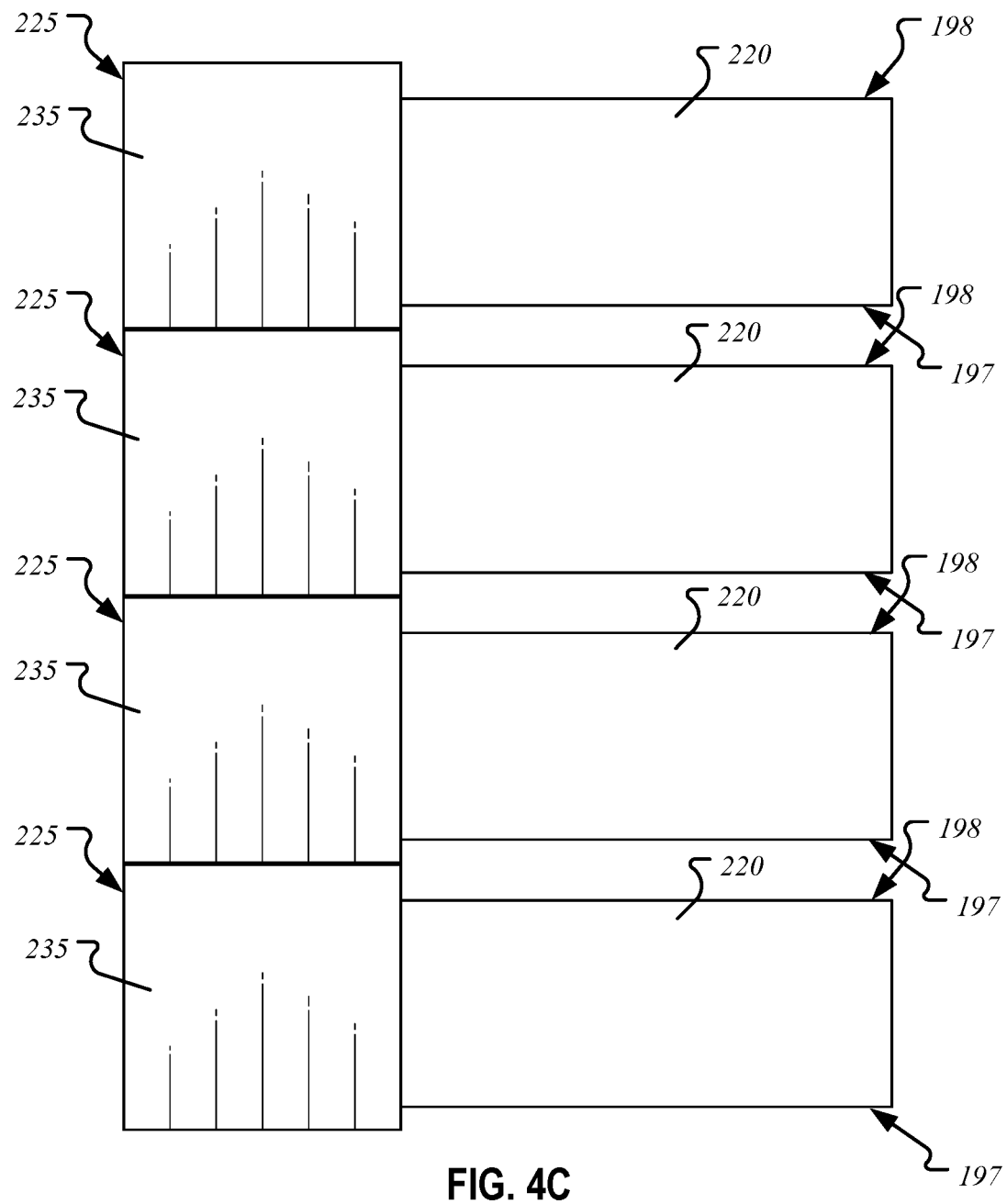
FIG. 4C is a side-view schematic of multiple PCBs with mounted edge mount connectors stacked together, according to an exemplary embodiment of the present disclosure.

FIG. 4C illustrates a side elevational view of multiple PCBs 220 with mounted edge mount connectors 225 stacked together to form a PCB 220 stack, according to an exemplary embodiment of the present disclosure. Notably, the orientation of the edge mount connector 225 disposed along the side edge 299 of the PCB 220, when mounted, are not over the area of the top surface 198 and bottom surface 197 of the PCB 220, and can allow for relatively more dense stacking of multiple PCBs 220 as compared to a configuration where the connector is disposed over the area of the top surface 198 and bottom surface 197 of the PCB 220. It may be appreciated that the height h of the housing 235 may be designed to provide adequate spacing between each PCB 220 in order to allow for cooling and thermal expansion, or to eliminate the spacing entirely. For example, the PCB 220 may include an air-cooling system, wherein there may be spacing between the PCBs 220 for air to travel between and undergo thermal exchange with the PCBs 220. For example, the PCB 220 may include an integrated water-cooling system, wherein the spacing between the PCBs 220 may be eliminated for more dense stacking.

Figure 5A:
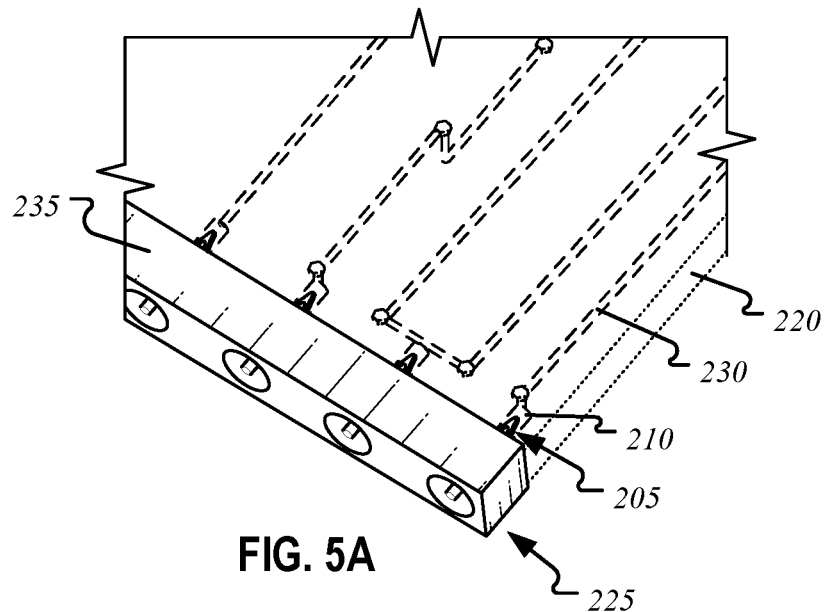
FIG. 5A is a perspective view of tracks in layers of the PCB, according to an exemplary embodiment of the present disclosure.
Figure 5B:
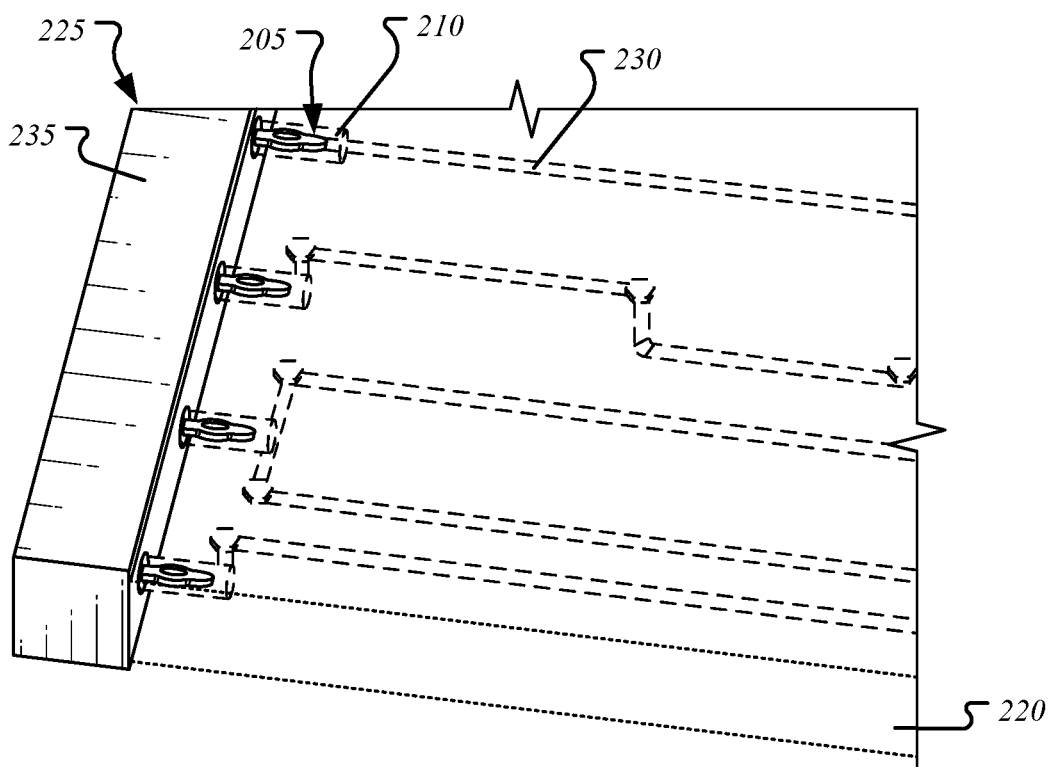
FIG. 5B is a perspective view of the tracks in the layers of the PCB, according to an exemplary embodiment of the present disclosure.

FIGS. 5A and 5B illustrate perspective views of exemplary electrical connections in the layers of the PCB 220, according to an exemplary embodiment of the present disclosure. In an embodiment, the PCB 220 may include at least one track 230. The at least one track 230 may be a conducting electrical connection between components in and/or on the PCB 220. That is to say, the at least one track 230 may start in an internal layer and terminate in another internal layer (or the same internal layer), start on the top surface 198 and terminate on the top surface 198, start in an internal layer and terminate on the top surface 198 or bottom surface 197, or start on the top surface 198 or bottom surface 197 and terminate in an internal layer. For example, the at least one track 230 may electrically couple the plating 215 in the blind edge via 210 (and thus the pin 205 inserted therein) to a component on the top surface 198 through a blind via (not shown) extending partially into the PCB 220.

Notably, for the scenario where the at least one track 230 may start in an internal layer and terminate in another internal layer (or the same internal layer), the position of the at least one blind edge via 210 along the side edge 299 may allow for the at least one track 230 to only travel from the blind edge via 210 to the target electrical component in the PCB 220 between two layers without traveling across other layers. The at least one track 230 may be fabricated from a conductive material, for example copper, gold, silver, graphene, or aluminum. A plurality of the tracks 230 may originate from a single component, for example one of the blind edge vias 210 may split into two of the tracks 230 at the connection point.

Figure 6:
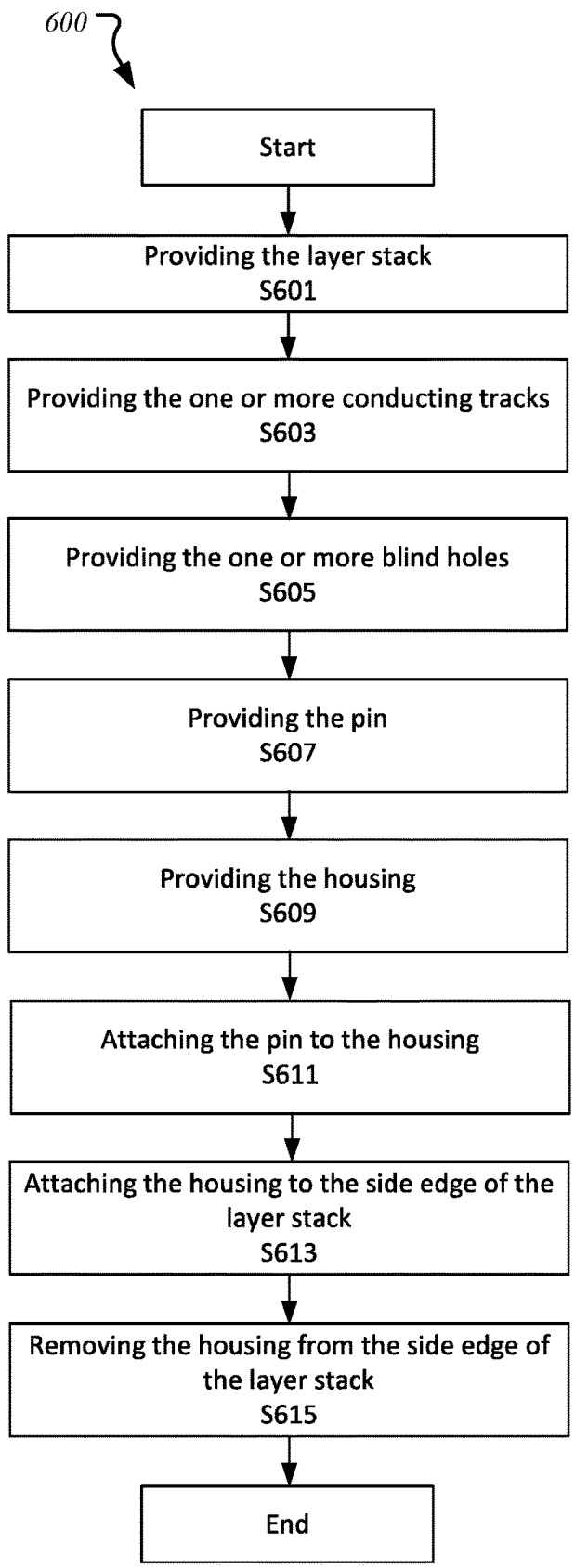
FIG. 6 is a flow chart of a method according to embodiments of the disclosed subject matter.

FIG. 6 is a flow diagram for a method 600 according to an exemplary embodiment of the present disclosure.

In step S601, the layer stack of the PCB 220 may be provided. In step S603, the at least one track 230 in the PCB 220 may be provided. In step S605, the one or more blind edge vias 210 may be provided. In step S607, the pins 205 may be provided. In step S609, the housing 235 of the edge mount connector 225 may be provided. In step S611, the pins 205 may be attached to the housing 235. In step S613, the housing 235 may be attached to the side edge 299 of the layer stack of the PCB 220. In step S615, the housing 235 may be optionally removed from the side edge 299 of the layer stack of the PCB 220.

Advantageously, multiple PCBs 220 and edge mount connectors 225 may be closely stacked in a layered configuration (such that the planes of each PCB 220 are substantially parallel to each other in the stack) due to the side edge positioning of the plurality of the at least one blind edge via 210. This is also due to the compliant portion 230 of the pin 205 securing the pin 205 and the edge mount connector 225 to the blind edge vias 210 without additional fastening devices. Since additional fastening devices may not be needed, less manufacturing material can be used to form the edge mount connector 225, allowing for a more compact form factor that enables dense stacking. Moreover, the height h of the edge mount connector 225 may be determined based on a desired spacing between layers of PCBs 220 in the stacked configuration. The height h larger than the thickness t may allow for space between PCB 220 layers for cooling and thermal expansion. A height h being substantially equal to the thickness t may allow for denser packaging.

As previously mentioned, through-hole vias (i.e., vias formed substantially transverse to the plane of the PCB 220) may generate electromagnetic radiation that can emit from the side edges of the PCB 220 and cause interference. In another advantage, the at least one blind edge via 210 being positioned along the edge of the PCB 220 may not result in electromagnetic radiation generation traveling between two conductive layers of the multi-layer stack, and thus may not emit from the edges of the PCB 220 like a slot antenna.

As previously mentioned, forming through-hole vias in the PCB 220 may result in the stub portion when only a portion of the through-hole via is used to electrically connect the through-hole via to another component in or on the PCB 220. In another advantage, the at least one blind edge via 210 may not include a stub portion from which the quarter-wavelength reflection occurs (and thus the half cycle cancelling signal), thereby reducing or eliminating the signal degrading effects of resonance nulls.

Implementations of the disclosed subject matter may also be as set forth in the following parentheticals.

(1) A printed circuit board (PCB) device, comprising: one or more insulating layers and one or more conducting layers arranged to form a layer stack, a plane of the one or more insulating layers being parallel to a plane of the one or more conducting layers; one or more conducting tracks; and one or more blind holes disposed in a side edge of the layer stack, each of the one or more blind holes having a depth that extends from the side edge into the layer stack in a direction parallel to the plane of the one or more insulating layers and the plane of the one or more conducting layers, the one or more blind holes being plated with a conducting material, wherein each of the one or more blind holes is configured to receive a pin.

(2) The device of (1), wherein the conducting tracks electrically couple the one or more blind holes to components on the PCB.

(3) The device of either (1) or (2), wherein each of the one or more conducting tracks starts and terminates in an interior layer of the layer stack (4) The device of any one of (1)-(3), further comprising: the pin having a compliant portion, wherein the one or more blind holes has a diameter and a depth, the pin has a length, and the compliant portion of the pin has a width, the length of the pin is no greater than the depth of the one or more blind holes, the diameter of the one or more blind holes is no greater than the width of the compliant portion of the pin, the compliant portion is configured to deform when the pin is inserted into the blind hole, and the compliant portion is configured to retain the pin in the blind hole when the pin is fully seated in the blind hole.

(5) The device of any one of (1)-(4), further comprising a housing configured to hold each said pin, the housing having a predetermined height, wherein the housing is configured to be removably mounted to the side edge of the layer stack such that each said pin held by the housing is inserted into and retained by a respective one of the one or more blind holes and such that the housing extends from the side edge parallel to the plane of the one or more insulating layers and the plane of the one or more conducting layers.

(6) The device of any one of (1)-(5), wherein each of the one or more blind holes is configured to retain the pin via a press fit.

(7) The device of any one of (1)-(6), wherein the predetermined height of the housing is substantially equal to a thickness of the layer stack.

(8) The device of any one of (1)-(7), further comprising a plurality of the PCBs, wherein the plurality of PCBs form a stack in a thickness direction of the PCBs, the stack of PCBs have a top surface and a bottom surface opposite the top surface, and the housing is disposed along the side edge of each of the plurality of the PCBs and is not disposed over the top or bottom surfaces of the stack of PCBs.

(9) A printed circuit board (PCB) system, comprising one or more insulating layers and one or more conducting layers arranged to form a layer stack; one or more blind holes disposed along a side edge of the layer stack and parallel to a plane of the layer stack; at least one pin; and a housing configured to hold the at least one pin and be removably mounted to the side edge of the layer stack, wherein each said at least one pin held by the housing is configured to be inserted into and retained by a respective one of the one or more blind holes.

(10) The system of (9), wherein the at least one pin includes a compliant portion, the one or more blind holes have a diameter and a depth, the at least one pin has a length, and the compliant portion of the at least one pin has a width, the length of the at least one pin is no greater than the depth of the one or more blind holes, the diameter of the one or more blind holes is no greater than the width of the compliant portion of the at least one pin, the compliant portion is configured to deform when the pin is inserted into the blind hole, and the compliant portion is configured to retain the pin in the blind hole when the pin is fully seated in the blind hole.

(11) The system of either (9) or (10), wherein a height of the housing is substantially equal to a thickness of the layer stack.

(12) The device of any one of (9)-(11), further comprising a plurality of the PCBs, wherein the plurality of PCBs form a stack in a thickness direction of the PCBs, the stack of PCBs have a top surface and a bottom surface opposite the top surface, and the housing is disposed along the side edge of each of the plurality of the PCBs and is not disposed over the top or bottom surfaces of the stack of PCBs.

(13) The device of any one of (9)-(12), further comprising: one or more conducting tracks, wherein the conducting tracks electrically couple the one or more blind holes to components on the PCB.

(14) The device of any one of (9)-(13), wherein each of the one or more conducting tracks starts and terminates in an interior layer of the layer stack.

(15) A method, comprising: providing one or more insulating layers and one or more conducting layers arranged to form a layer stack, a plane of the one or more insulating layers being parallel to a plane of the one or more conducting layers; providing one or more conducting tracks to electrically couple one or more blind holes to components on the layer stack; and providing one or more blind holes disposed in a side edge of the layer stack, each of the one or more blind holes having a depth that extends from the side edge into the layer stack in a direction parallel to the plane of the one or more insulating layers and the plane of the one or more conducting layers, the one or more blind holes being plated with a conducting material, wherein each of the one or more blind holes is configured to receive a pin.

(16) The method of (15), further comprising: providing the pin having a compliant portion, wherein the one or more blind holes has a diameter and a depth, the pin has a length, and the compliant portion of the pin includes a width, the length of the pin is no greater than the depth of the one or more blind holes, the diameter of the one or more blind holes is no greater than the width of the compliant portion of the pin, and said providing the pin includes the compliant portion deforming when the pin is inserted into the blind hole, and the compliant portion retaining the pin in the blind hole when the pin is fully seated in the blind hole.

(17) The method of either (15) or (16), further comprising providing a housing configured to hold each said pin, the housing having a predetermined height, wherein providing the housing includes the housing being configured to be removably mounted to the side edge of the layer stack such that each said pin held by the housing is inserted into and retained by a respective one of the one or more blind holes and such that the housing extends from the side edge parallel to the plane of the one or more insulating layers and the plane of the one or more conducting layers.

(18) The method of any one of (15)-(17), wherein said providing the housing includes the one or more blind holes retaining each said pin via a press fit.

(19) The method of any one of (15)-(18), wherein the predetermined height of the housing is substantially equal to a thickness of the layer stack

(20) The method of any one of (15)-(19), further comprising separating the housing from the layer stack, wherein the layer stack includes a plurality of the blind holes and the pins, and the separating the housing from the layer stack includes substantially simultaneous extraction of the plurality of pins from the blind holes.

Obviously, numerous modifications and variations are possible in light of the above teachings. It is therefore to be understood that within the scope of the appended claims, the invention may be practiced otherwise than as specifically described herein. For example, preferable results may be achieved if the steps of the disclosed techniques were performed in a different sequence, if components in the disclosed systems were combined in a different manner, or if the components were replaced or supplemented by other components.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:

1. A printed circuit board (PCB) system, comprising:
one or more insulating layers and one or more conducting layers arranged to form a layer stack;
one or more blind holes disposed along a side edge of the layer stack and parallel to a plane of the layer stack;
at least one pin; and
a housing configured to hold the at least one pin and be removably mounted to the side edge of the layer stack, wherein
each said at least one pin held by the housing is configured to be inserted into and retained by a respective one of the one or more blind holes,
wherein a force asserted by a portion of the said at least one pin against the respective one of the one or more blind holes attaches the housing to the side edge of the layer stack.

2. The system of claim 1, wherein
the at least one pin includes a compliant portion,
the one or more blind holes have a diameter and a depth,
the at least one pin has a length, and the compliant portion of the at least one pin has a width,
the length of the at least one pin is no greater than the depth of the one or more blind holes,
the diameter of the one or more blind holes is no greater than the width of the compliant portion of the at least one pin,
the compliant portion is configured to deform when the pin is inserted into the blind hole, and
the compliant portion is configured to retain the pin in the blind hole when the pin is fully seated in the blind hole.

3. The system of claim 1, wherein a height of the housing is substantially equal to a thickness of the layer stack.

4. The system of claim 1, further comprising a plurality of the PCBs, wherein
the plurality of PCBs form a stack in a thickness direction of the PCBs,
the stack of PCBs have a top surface and a bottom surface opposite the top surface, and
the housing is disposed along the side edge of each of the plurality of the PCBs and is not disposed over the top or bottom surfaces of the stack of PCBs.

5. The system of claim 1, further comprising:
one or more conducting tracks, wherein
the conducting tracks electrically couple the one or more blind holes to components on the PCB.

6. The system of claim 5, wherein each of the one or more conducting tracks starts and terminates in an interior layer of the layer stack.

7. A printed circuit board (PCB) system, comprising:
a layer stack comprising one or more layers;
one or more blind holes disposed in a side edge of the layer stack, each of the one or more blind holes having a depth that extends from the side edge into the layer stack in a direction parallel to a plane of a layer of the layer stack; and
a housing comprising a side surface, the housing configured to hold one or more pins, wherein the one or more pins extend from the side surface of the housing and wherein the side surface of the housing is configured to mount to the side edge of the layer stack,
wherein each of the one or more blind holes is configured to receive one of the one or more pins, and
wherein the housing is disposed along a side edge of the layer stack and is not disposed over a top surface or a bottom surface of the layer stack.

8. The system of claim 7, wherein the housing further comprises a top surface and a bottom surface opposite the top surface, and wherein a predetermined height of the housing separates the top surface and the bottom surface.

9. The system of claim 8, wherein the side surface is perpendicular to the top surface.

10. The system of claim 8, wherein the predetermined height of the housing is substantially equal to a thickness of the layer stack.

11. The system of claim 7, wherein:
the one or more blind holes includes at least two blind holes,
the one or more pins includes at least two pins, and
a spacing between the at least two pins is substantially equal to a spacing between the at least two blind holes.

12. The system of claim 7, wherein:
each of the one or more blind holes has a diameter and a depth;
each of the one or more pins has a length and a compliant portion;
the compliant portion has a width;
the length of each of the one or more pins is no greater than the depth of each of the one or more blind holes;
the diameter of each of the one or more blind holes is no greater than the width of the compliant portion;
the compliant portion is configured to deform when one of the one or more pins is inserted into one of the one or more blind holes; and
the compliant portion is configured to retain the one of the one or more pins in the one of the one or more blind holes when the one of the one or more pins is fully seated in the one of the one or more blind holes.

13. The system of claim 7, further comprising a plurality of the PCBs, wherein:
the plurality of PCBs forms a stack in a thickness direction of the PCBs, and
the stack of PCBs has a top surface and a bottom surface opposite the top surface.

14. The system of claim 13, wherein the housing is disposed along a side edge of each of the plurality of the PCBs and is not disposed over the top surface or the bottom surface of the stack of PCBs.

15. A method comprising:
providing a plurality of printed circuit boards (PCBs) forming a stack in a thickness direction of the plurality of PCBs, wherein the stack of PCBs has a top surface and a bottom surface opposite the top surface;
providing one or more blind holes disposed in a side edge of at least one PCB of the plurality of PCBs, each of the one or more blind holes having a depth that extends from the side edge into the at least one PCB in a direction parallel to a plane of a layer of the at least one PCB; and
providing a housing comprising a side surface, the housing configured to hold one or more pins, wherein the one or more pins extend from the side surface of the housing and wherein the side surface of the housing is configured to mount to the side edge of the at least one PCB,
wherein each of the one or more blind holes is configured to receive one of the one or more pins, and
wherein the housing is disposed along a side edge of each of the plurality of the PCBs and is not disposed over the top surface or the bottom surface of the stack of PCBs.

16. The method of claim 15, wherein the housing further comprises a top surface and a bottom surface opposite the top surface, and wherein a predetermined height of the housing separates the top surface and the bottom surface.

17. The method of claim 16, wherein the side surface is perpendicular to the top surface and wherein the predetermined height of the housing is substantially equal to a thickness of the stack of PCBs.

18. The method of claim 15, wherein:
the one or more blind holes includes at least two blind holes,
the one or more pins includes at least two pins, and
a spacing between the at least two pins is substantially equal to a spacing between the at least two blind holes.

* * * * *